United States Patent
Itai et al.

(10) Patent No.: US 7,126,159 B2
(45) Date of Patent: Oct. 24, 2006

(54) PLURAL LEDS MOUNTED WITHIN A CENTRAL CUTOUT OF A SURROUNDING CIRCULAR REFLECTIVE ELECTRODE

(75) Inventors: Junichi Itai, Kyoto (JP); Takayuki Ishihara, Kyoto (JP); Takeshi Kitamura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 15 days.

(21) Appl. No.: 10/505,845

(22) PCT Filed: Mar. 3, 2003

(86) PCT No.: PCT/JP03/02448

§ 371 (c)(1),
(2), (4) Date: Aug. 25, 2004

(87) PCT Pub. No.: WO03/075367

PCT Pub. Date: Sep. 12, 2003

(65) Prior Publication Data

US 2005/0122031 A1 Jun. 9, 2005

(30) Foreign Application Priority Data

Mar. 5, 2002 (JP) .............................. 2002-059122

(51) Int. Cl.
*H01L 33/00* (2006.01)
*H05B 33/06* (2006.01)

(52) U.S. Cl. ................... 257/91; 257/98; 257/E33.065

(58) Field of Classification Search ................. 257/88, 257/89, 91, 98, 99, 100; 313/498, 512
See application file for complete search history.

(56) References Cited

U.S. PATENT DOCUMENTS

| 6,236,382 B1 * | 5/2001 | Kawakami et al. ........... 345/83 |
| 6,335,548 B1 * | 1/2002 | Roberts et al. ............... 257/98 |
| 6,531,328 B1 * | 3/2003 | Chen .......................... 438/26 |
| 6,611,000 B1 * | 8/2003 | Tamura et al. ............... 257/80 |
| 2004/0099874 A1 * | 5/2004 | Chang et al. ................ 257/98 |

FOREIGN PATENT DOCUMENTS

| EP | 1 059 667 | 12/2000 |
| JP | 61-1067 | 1/1986 |
| JP | 4-28269 | 1/1992 |
| JP | 11-121805 | 4/1999 |

* cited by examiner

*Primary Examiner*—Eddie Lee
*Assistant Examiner*—Andrew O Arena

(74) *Attorney, Agent, or Firm*—Hamre, Schumann, Mueller & Larson, P.C.

(57) ABSTRACT

A light emitting device includes a first patterned electrode 12 and a second patterned electrode 13 both of which are formed on a wiring board 11, an LED chip 19 mounted on the second patterned electrode 13, a metal wire 20 electrically connecting the LED chip 19 and the first patterned electrode 12 to each other, and a lens member 21 made of a transparent synthetic resin for packaging the LED chip 19 and the metal wire 20. The first patterned electrode 12 is circular and formed with a cutout 14 at the center thereof. The second patterned electrode 13 is arranged in the cutout 14. With this arrangement, the lens member 21 can be formed into a predetermined configuration, while the reflection of light by the patterned electrodes can be ensured.

6 Claims, 5 Drawing Sheets

PLURAL LEDS MOUNTED WITHIN A CENTRAL CUTOUT OF A SURROUNDING CIRCULAR REFLECTIVE ELECTRODE

BACKGROUND OF THE INVENTION

1. Field of the Invention

The present invention relates to a light emitting device including an LED chip mounted on e.g. a printed wiring board and packaged in a lens member made of a synthetic resin, while also relating to a method of making such a device.

2. Description of the Related Arts

A typical light emitting device of the above-described type includes a pair of first patterned electrode and second patterned electrode formed on an upper surface of a wiring board. On the upper surface of the second patterned electrode is mounted an LED chip, which is electrically connected to the first patterned electrode by wire bonding using a thin metal wire. A lens member made of a transparent synthetic resin is formed on the upper surface of the wiring board at the portion where the LED chip is mounted to package the LED chip and the metal wire.

FIGS. 10 and 11 show a structure disclosed in JP-A 4-28269 as a prior art device. Specifically, a second patterned electrode 2 of a metal film is formed into a circular configuration on the upper surface of a wiring board 1, and an LED chip is mounted at the center of the circle. The circular second patterned electrode 2 is formed with a cutout 4 extending radially inward from the circumference of the circle toward the LED chip 3. A first patterned electrode 5 of a metal film is formed on the upper surface of the wiring board 1 to extend radially outward from a portion within the cutout 4. The inner end of the first patterned electrode 5 is electrically connected to the LED chip 3 by wire bonding using a thin metal wire 6. On the upper surface of the second patterned electrode 2 is provided a lens member 7 formed by dropping an appropriate amount of transparent synthetic resin in a liquid state onto the second patterned electrode for bulging the resin into a hemispherical configuration and then hardening the resin.

In the prior art structure, since the lens member 7 is provided on the second patterned electrode 2 in the form of a circular metal film, the circular second patterned electrode 2 serves as a reflection film of the light emitted from the LED chip 3, whereby the brightness of the emitted light is enhanced.

However, the following problem is caused by the provision of the cutout 4 extending from the circumference of the second patterned electrode 2 toward the LED chip 3 and the provision of the first patterned electrode 5 of the metal film in the cutout 4 to extend radially outward.

When the transparent synthetic resin for forming the lens member 7 is dropped, in a liquid state, onto the upper surface of the circular second patterned electrode 2, the transparent synthetic resin spreads radially outward over the circular second patterned electrode 2 to reach the outer circumference of the second patterned electrode 2 and bulges into a generally hemispherical configuration on the second patterned electrode due to the surface tension. In this state, the synthetic resin is hardened to become the lens member 7.

However, since the outer circumference of the second patterned electrode 2 is interrupted at the portion formed with the cutout 4, and the first patterned electrode 5 is provided at the cutout 4 to project outward, part of the transparent synthetic resin dropped in a liquid state onto the second patterned electrode 2 spreads through the cutout 4, i.e. along the upper surface of the first patterned electrode 5 to project outward from the outer circumference of the second patterned electrode 2.

As a result, the lens member 7 after the hardening does not become a round circle corresponding to the configuration of the second patterned electrode 2 as viewed in plan but becomes an irregular shape partially projecting outward at the portion where the first patterned electrode 5 is provided. Further, the configuration cannot be made generally uniform with respect to a plurality of lens members 7, and the variation of the configuration of the lens members is large.

Conventionally, to solve the above problem, a dam ring 8 surrounding the LED chip 3 and the metal wire 6 is provided on the upper surface of the circular second patterned electrode 2, as shown in FIG. 12. By dropping the transparent synthetic resin in a liquid state into the dam ring 8, the lens member 7 having a predetermined configuration can be formed, and the variation of the lens configuration can be reduced.

However, the provision of the dam ring 8 on the circular second patterned electrode 2 increases the manufacturing cost, which may result in the price increase. Further, the dam ring 8 blocks the light emitted from the LED chip 3 to reduce the amount of light.

It is, therefore, an object of the present invention to provide a light emitting device capable of solving the above-described problems and to provide a method of making such a device.

DISCLOSURE OF THE INVENTION

According to a first aspect of the present invention, which relates to a light emitting device structure, there is provided a light emitting device comprising: a first patterned electrode and a second patterned electrode both of which are made of a metal film and provided on an obverse surface of a wiring board; an LED chip mounted on the second patterned electrode; a metal wire electrically connecting the LED chip and the first patterned electrode to each other; and a lens member made of a transparent synthetic resin and provided on the obverse surface of the wiring board for packaging the LED chip and the metal wire. The first patterned electrode is circular and has a central cutout, and the second patterned electrode is arranged in the cutout.

With such an arrangement, since the second patterned electrode is disposed in the cutout formed at the center of the circular first patterned electrode, the circular first patterned electrode completely surrounds the entire circumference of the second patterned electrode to which the LED chip is mounted. The outer circumference of the first patterned electrode becomes a completely closed circle with no interruption. Therefore, when an appropriate amount of transparent synthetic resin in a liquid state is dropped onto the first patterned electrode, the liquid transparent synthetic resin spreads radially outward over the upper surface of the first patterned electrode to reach the outer circumference of the first patterned electrode and bulges, due to the surface tension, into a generally hemispherical configuration without spreading beyond the outer circumference of the first patterned electrode. Therefore, unlike the prior art structure, projecting of the bulged transparent synthetic resin beyond the circumference of the circle, which results in an irregular configuration of the lens member, can be reliably prevented.

Moreover, since both of the circular first patterned electrode and the second patterned electrode arranged in the cutout of the first patterned electrode are made of a metal film, the light emitted from the LED chip can be reflected away from the wiring board.

Therefore, according to the first aspect, the light emitted from the LED chip can be reliably reflected toward the lens member by each of the patterned electrodes. Further, the lens member can be formed into a predetermined configuration, and variation of the lens configuration can be reduced. Moreover, unlike the prior art structure, a dam ring for surrounding the lens member need not be provided, so that the brightness of the light can be enhanced.

According to a second aspect of the present invention, which also relates to a light emitting device structure, there is provided a light emitting device comprising: a first patterned electrode and a plurality of second patterned electrodes, the first and second patterned electrodes being made of a metal film and provided on an obverse surface of a wiring board; LED chips each mounted on a respective one of the second patterned electrodes; metal wires each electrically connecting a respective one of the LED chips and the first patterned electrode; and a lens member made of a transparent synthetic resin and provided on the obverse surface of the wiring board for packaging the LED chips and the metal wires. The first patterned electrode is circular and has a central cutout. The second patterned electrodes are arranged in the cutout while being equally spaced from each other along the circumference of a circle which is generally concentric with the circle of the first patterned electrode. The metal wires electrically connecting the LED chips mounted on the second patterned electrodes to the first patterned electrode extend radially outward.

With such a structure, the metal wires for a plurality of LED chips provided in the single lens member extend radially outward. Therefore, the radially outward flow of the liquid transparent synthetic resin dropped onto the first patterned electrode occurs generally in the same manner at respective portions provided with the metal wires. As a result, the liquid transparent synthetic resin reliably spreads to become a round circle. Therefore, the same advantages as described above can be provided with respect to a light emitting device provided with a plurality of LED chips.

In the first aspect and the second aspect, the wiring board has a reverse surface formed with a power supply wiring pattern for electrical connection to the first patterned electrode and the second patterned electrode via a through-hole formed in the wiring board. With such a structure, the power supply for the first patterned electrode and the second patterned electrode can be performed by the power supply wiring pattern formed on the reverse surface of the wiring board, and the formation of the power supply wiring pattern on the reverse surface can be performed easily.

In the second aspect, the cutout of the first patterned electrode may have a peripheral edge which includes an indentation entering between the second patterned electrodes. With such an arrangement, the light reflective surface comprising the first patterned electrode can be increased by as much as the portions entering between the second patterned electrodes, whereby the brightness of the light can be further enhanced.

According to a third aspect of the present invention, which relates to a method of making a light emitting device, a method is provided which comprises the steps of: forming, on a wiring board, a first patterned electrode of a metal film into a circular configuration while forming a cutout at the center of the first patterned electrode; forming a second patterned electrode of a metal film in the cutout; mounting an LED chip on the second patterned electrode; electrically connecting the LED chip and the first patterned electrode to each other via a metal wire; and forming a lens member by dropping transparent synthetic resin in a liquid state onto the first patterned electrode so that the transparent synthetic resin bulges to cover the LED chip and the metal wire and then hardening the synthetic resin.

With such a method, unlike the prior art technique, a light emitting device having the above-described advantages can be manufactured at low cost without using a dam ring surrounding the lens member.

Other objects, features and advantages of the present invention will become clearer from the description of the embodiments given below with reference to accompanying drawings.

DETAILED DESCRIPTION OF THE PREFERRED EMBODIMENTS

Preferred embodiments of the present invention will be described below with reference to the accompanying drawings.

Figure 1:
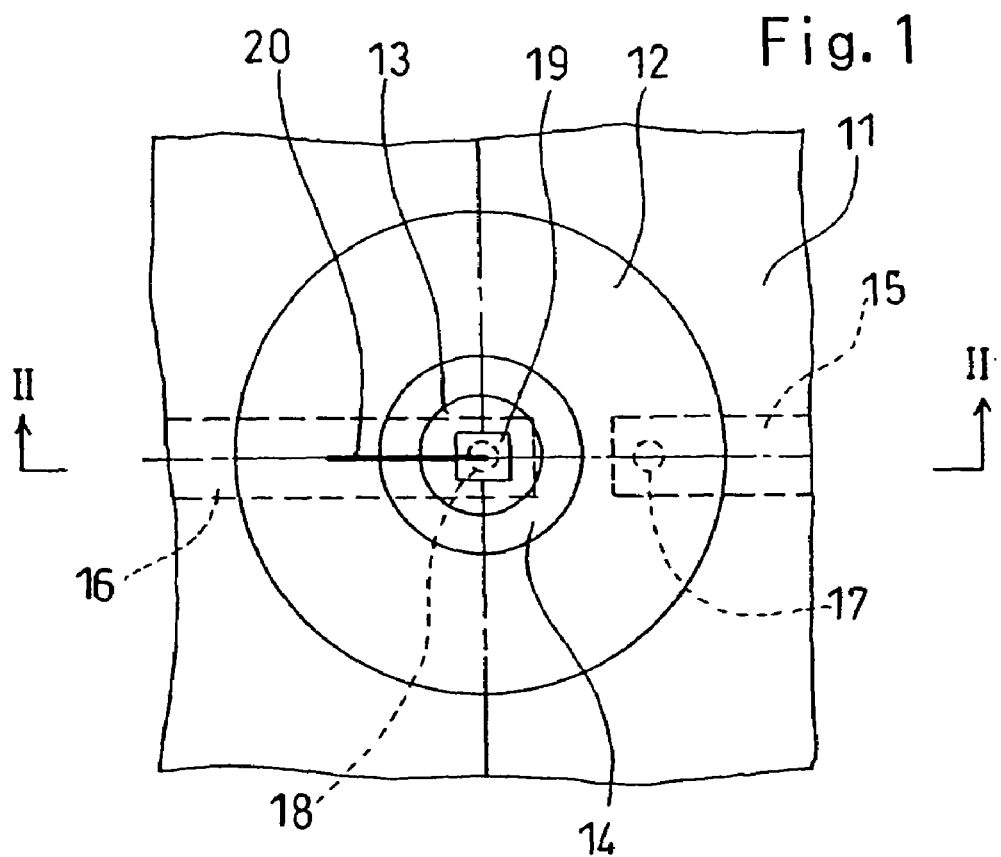
FIG. 1 is a plan view showing a first embodiment of the present invention.
Figure 2:
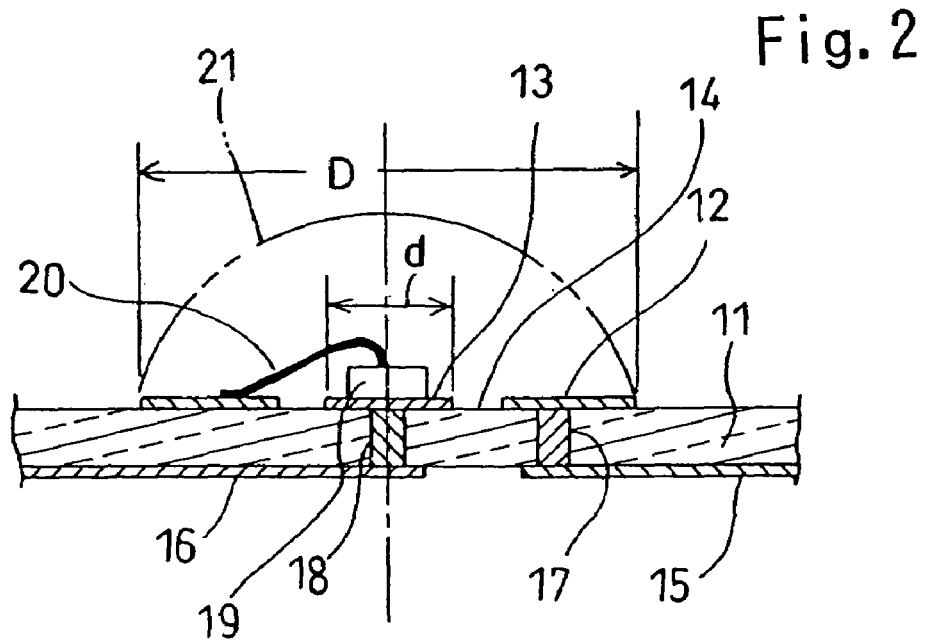
FIG. 2 is a sectional view taken along lines II—II in FIG. 1.

FIGS. 1 and 2 show a first embodiment of the present invention. In this embodiment, a single LED chip is utilized.

Designated by the reference sign 11 in these figures is a wiring board made of an insulating material such as glass-fiber-reinforced epoxy resin (glass fibers hardened with an epoxy resin). On the upper surface of the wiring board 11 are formed a first patterned electrode 12 and a second patterned electrode 13, which are made of a metal film comprising a copper foil and a gold plating layer formed thereon via an underlying nickel plating layer, for example.

The first patterned electrode 12 is circular with a diameter D. The first patterned electrode 12 has a cutout 14 at the center thereof. The second patterned electrode 13 is circular with a smaller diameter d and arranged in the cutout 14 of the first patterned electrode 12 while being spaced from the first patterned electrode 12 like an island.

On the lower surface of the wiring board 11 are formed a power supply wiring pattern 15 for the first patterned electrode 12, and a power supply wiring pattern 16 for the second patterned electrode 13. The wiring patterns 15 and 16 are electrically connected to the patterned electrodes 12 and 13, respectively, via through holes 17 and 18 penetrating the wiring board 11.

On the second patterned electrode 13, an LED chip 19 is mounted, by die bonding, at a portion corresponding to the center of the circle of the first patterned electrode 12. The LED chip 19 is electrically connected to the first patterned electrode 12 by wire bonding using a thin metal wire 20.

An appropriate amount of transparent synthetic resin such as an epoxy resin in a liquid state is dropped onto the upper surface of the wiring board 11 at the portion formed with the first patterned electrode 12 (preferably at the general center of the first patterned electrode 12) by potting which is conventionally known.

The circular first patterned electrode 12 completely surrounds the entire circumference of the second patterned electrode 13 to which the LED chip 19 is mounted, and the outer circumference of the first patterned electrode is a completely closed circle with no interruption. Therefore, the transparent synthetic resin dropped thereon in a liquid state spreads radially outward over the upper surface of the first patterned electrode 12 to reach the outer circumference of the first patterned electrode 12 and bulges, due to the surface tension, into a generally hemispherical configuration without spreading beyond the outer circumference.

The liquid transparent synthetic resin bulged in the above manner is then hardened by heating or ultraviolet irradiation, thereby providing a generally hemispherical lens member 21 which packages the LED chip 19 and the metal wire 20.

Figure 3:
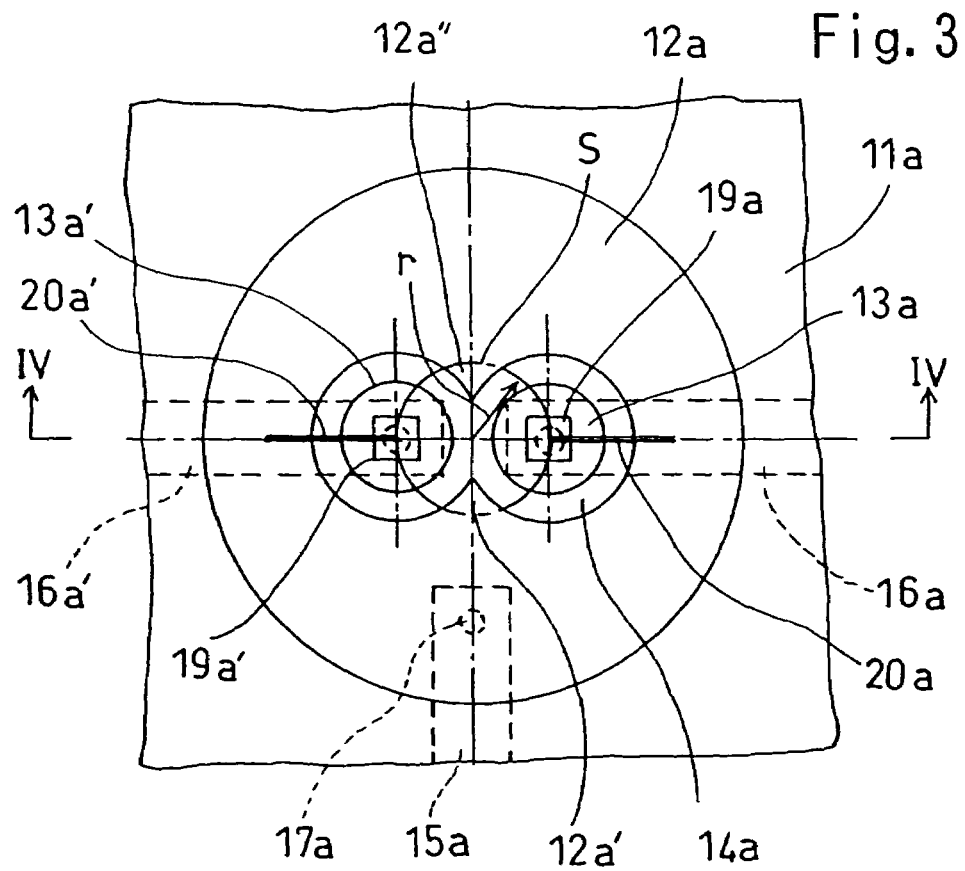
FIG. 3 is a plan view showing a second embodiment of the present invention.
Figure 4:
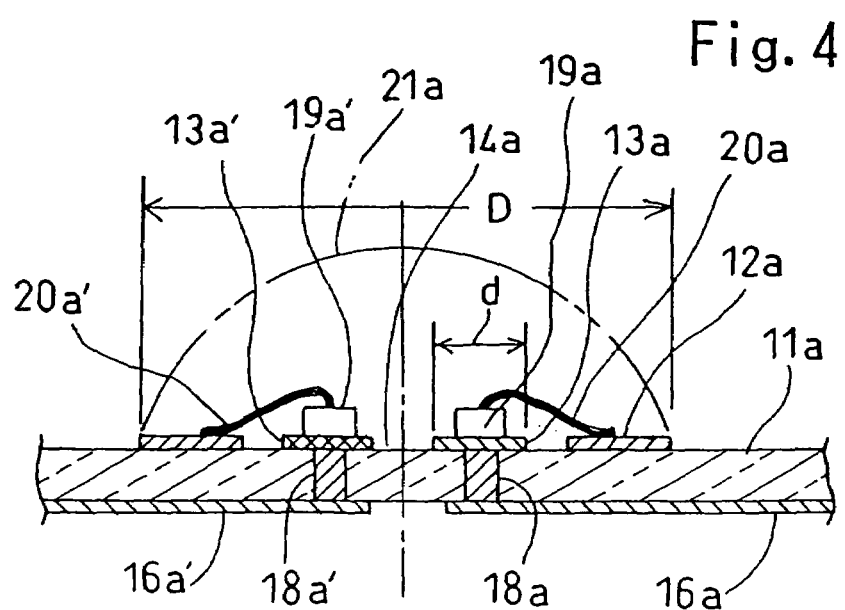
FIG. 4 is a sectional view taken along lines IV—IV in FIG. 3.

FIGS. 3 and 4 show a second embodiment of the present invention. In the second embodiment, two LED chips 19a, 19a' for emitting light of the same color or different colors are utilized.

Designated by the reference sign 11a in these figures is a wiring board made of an insulating material. On the upper surface of the wiring board 11a are formed a first patterned electrode 12a and two second patterned electrode 13a, 13a', which are made of a metal film similarly to those of the first embodiment.

The first patterned electrode 12a is circular with a diameter D. The first patterned electrode 12a has a cutout 14a at the center thereof. Each of the two second patterned electrodes 13a, 13a' is circular with a smaller diameter d. The two second patterned electrodes 13a, 13a' are arranged in the cutout 14a of the first patterned electrode 12a while being equally spaced, like islands, along the circumference of a circle s which is generally concentric with the circular first patterned electrode 12 and has a radius r, as viewed in plan (FIG. 3).

On the lower surface of the wiring board 11a are formed a power supply wiring pattern 15a electrically connected to the first patterned electrode 12a via a through hole 17a, a power supply wiring pattern 16a electrically connected to the second patterned electrode 13a via a through hole 18a, and a power supply wiring pattern 16a' electrically connected to the second patterned electrode 13a' via a through hole 18a'.

On the second patterned electrodes 13a and 13a' are mounted LED chips 19a and 19a', respectively, at the generally center thereof, by die bonding. The LED chips 19a, 19a' are electrically connected to the first patterned electrode 12a by wire bonding using thin metal wires 20a, 20a'.

The metal wires 20a, 20a' are so arranged as to extend in opposite directions from the LED chip 19a, 19a' as viewed in plan (FIG. 3), i.e., extend radially outward.

Similarly to the first embodiment, an appropriate amount of transparent synthetic resin in a liquid state is dropped onto the upper surface of the wiring board 11a at the portion formed with the first patterned electrode 12a (preferably at the general center of the first patterned electrode 12a) to cause the resin to bulge into a hemispherical configuration, and then the bulged resin is hardened. As a result, a hemispherical lens member 21a is provided which packages the LED chips 19a, 19a' and the metal wires 20a, 20a'.

As noted above, the metal wires 20a, 20a' for the LED chips 19a, 19a' extend in opposite directions from each other, i.e., extend radially outward. Therefore, the radially outward flow of the liquid transparent synthetic resin dropped onto the first patterned electrode 12a occurs generally in the same manner at respective portions provided with the metal wires 20a and 20a'. As a result, the liquid transparent synthetic resin reliably spreads to become a round circle, as viewed in plan (FIG. 3).

The peripheral edge of the cutout 14a of the first patterned electrode 12a includes indentations 12a', 12a" entering between the second patterned electrodes 13a and 13a'. By the provision of the indentations 12a' and 12a", the light reflective surface comprising the first patterned electrode 12a can be increased by as much as the portions entering between the second patterned electrodes 13a and 13a'.

Figure 5:
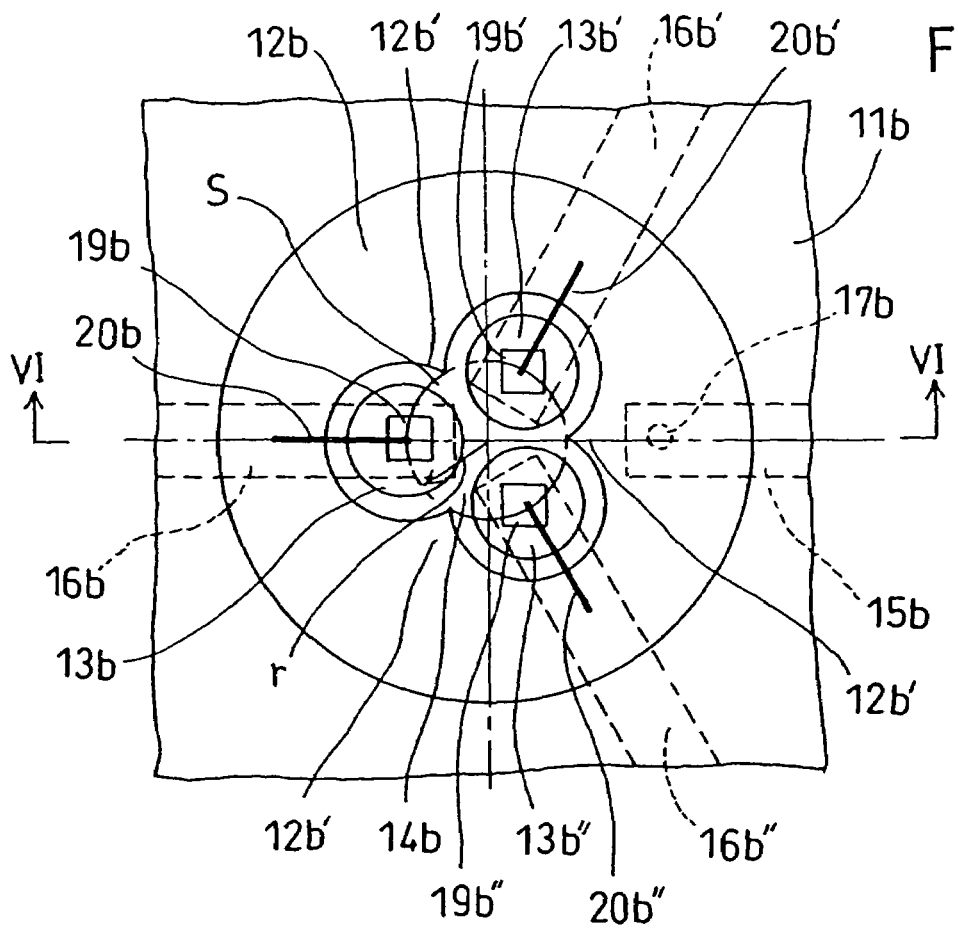
FIG. 5 is a plan view showing a third embodiment of the present invention.
Figure 6:
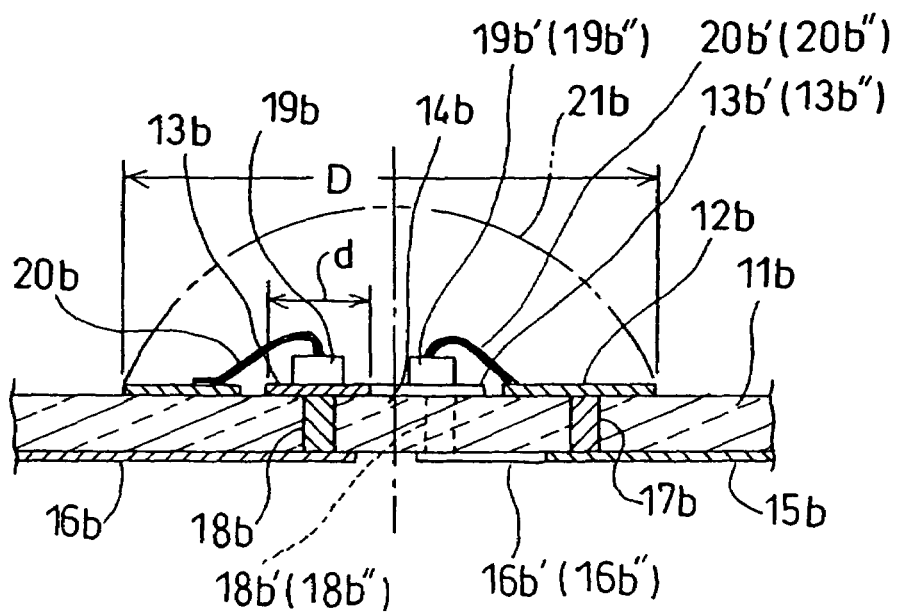
FIG. 6 is a sectional view taken along lines VI—VI in FIG. 5.

FIGS. 5 and 6 show a third embodiment of the present invention.

In the third embodiment, three LED chips, i.e., an LED chip 19b for emitting red light, an LED chip 19b' for emitting green light, and an LED chip 19b" for emitting blue light are utilized.

Designated by the reference sign 11b in these figures is a wiring board made of an insulating material. On the upper surface of the wiring board 11b, a first patterned electrode 12b and three second patterned electrode 13b, 13b', 13b" are formed, which are made of a metal film similarly to those of the first and the second embodiments.

The first patterned electrode 12b is circular with a diameter D. The first patterned electrode 12b has a cutout 14b at the center thereof. Each of the three second patterned electrodes 13b, 13b', 13b" is circular with a smaller diameter d. The three second patterned electrodes 13b, 13b', 13b" are arranged, like islands, in the cutout 14b of the first patterned electrode 12b while being equally spaced from each other i.e., spaced 120 degrees apart along the circumference of a circle s which is generally concentric with the circular first patterned electrode 12b and has a radius r, as viewed in plan (FIG. 5).

On the lower surface of the wiring board 11b are formed a power supply wiring pattern 15b electrically connected to the first patterned electrode 12b via a through hole 17b, a power supply wiring pattern 16b electrically connected to the second patterned electrode 13b via a through hole 18b, a power supply wiring pattern 16b' electrically connected to the second patterned electrode 13b' via a through hole 18b', and a power supply wiring pattern 16b" electrically connected to the second patterned electrode 13b" via a through hole 18b".

The LED chip 19b for emitting red light, the LED chip 19b' for emitting green light, and the LED chip 19b" for emitting blue light are mounted on the second wiring patterns 13b, 13b' and 13b", respectively, by die bonding. The LED chips 19b, 19b' and 19b" are electrically connected to the first patterned electrode 12b by wire bonding using thin metal wires 20b, 20b' and 20b", respectively.

The metal wires 20b, 20b' and 20b" are so arranged as to extend radially outward as viewed in plan (FIG. 5).

Subsequently, similarly to the first and the second embodiments, an appropriate amount of transparent synthetic resin in a liquid state is dropped onto the upper surface of the wiring board 11b at the portion formed with the first patterned electrode 12b (preferably at the general center of the first patterned electrode 12b) to cause the resin to bulge into a hemispherical configuration, and then the bulged resin is hardened. As a result, a hemispherical lens member 21b is provided which packages the LED chips 19b, 19b', 19b" and the metal wires 20b, 20b', 20b".

As noted above, the metal wires 20b, 20b', 20b" for the LED chips 19b, 19b', 19b" extend radially outward. Therefore, the radially outward flow of the liquid transparent synthetic resin dropped onto the first patterned electrode 12b occurs generally in the same manner at respective portions provided with the metal wires 20b, 20b', 20b". As a result, the liquid transparent synthetic resin reliably spreads to become a round circle, as viewed in plan (FIG. 5).

In the third embodiment again, the peripheral edge of the cutout 14b of the first patterned electrode 12b includes indentations 12b' entering between the second patterned electrodes 13b, 13b', 13b". The provision of the indentations 12b' increases the light reflective surface comprising the first patterned electrode 12b by as much as the portions entering between the second patterned electrodes 13b, 13b' and 13b".

Figure 7:
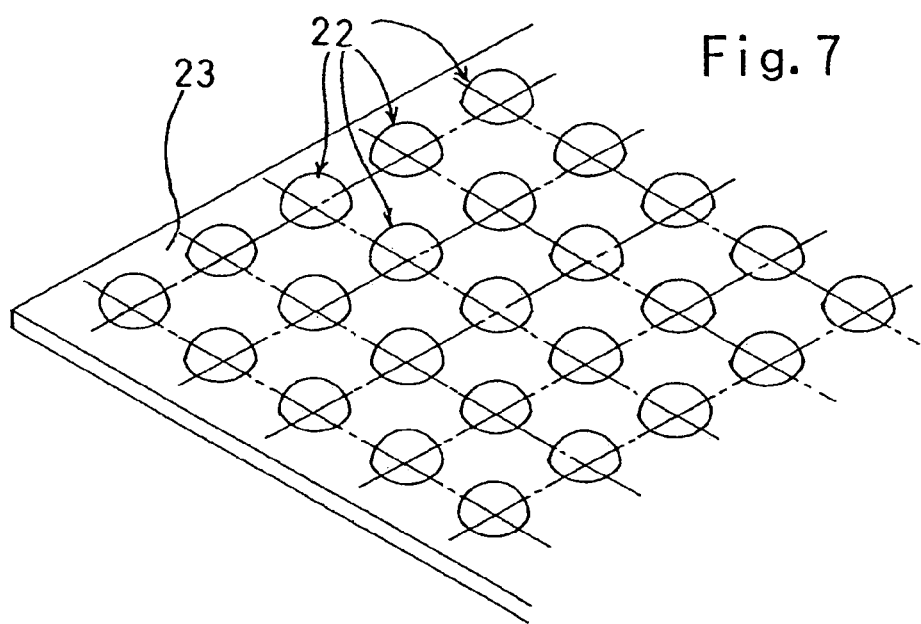
FIG. 7 is a perspective view showing a fourth embodiment of the present invention.
Figure 8:
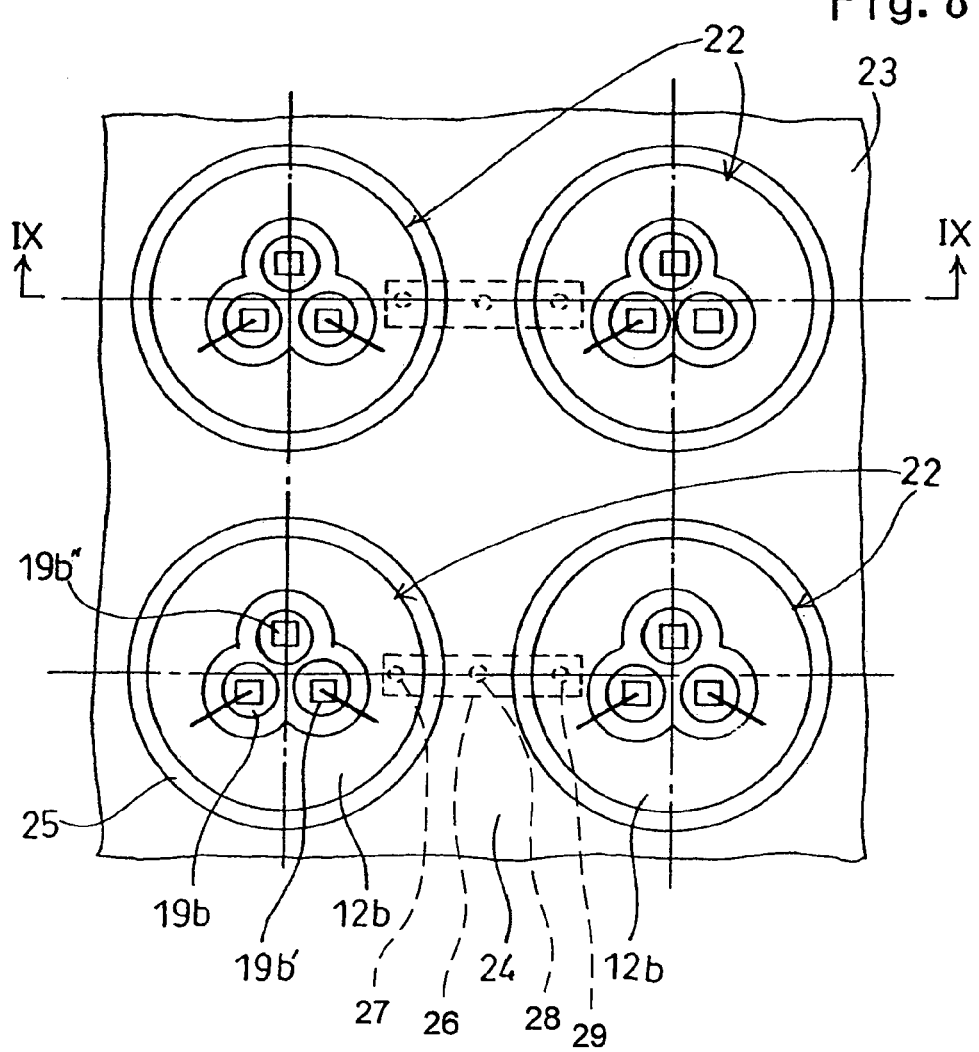
FIG. 8 is a plan view showing a principal portion of the fourth embodiment.
Figure 9:
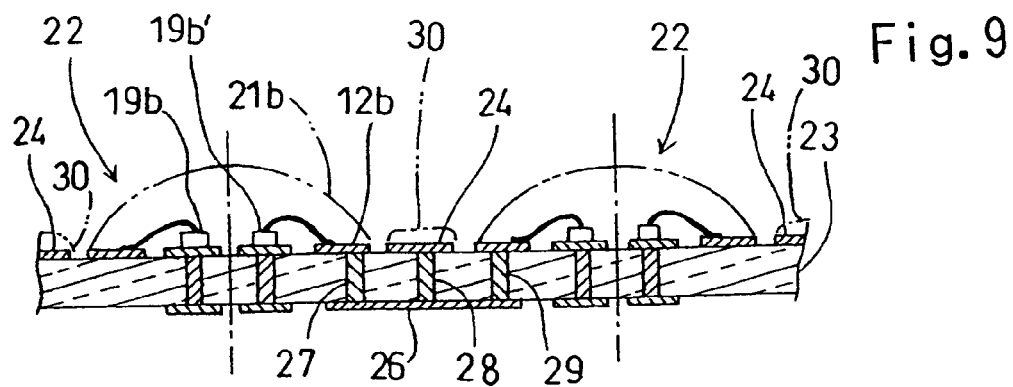
FIG. 9 is a sectional view taken along lines IX—IX in FIG. 8.
Figure 10:
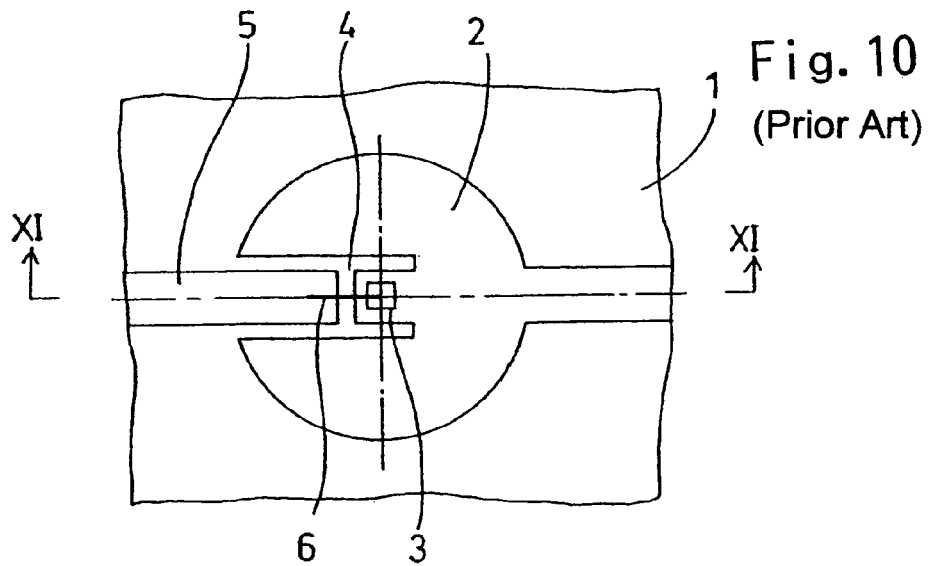
FIG. 10 is a plan view showing an example of prior art device.
Figure 11:
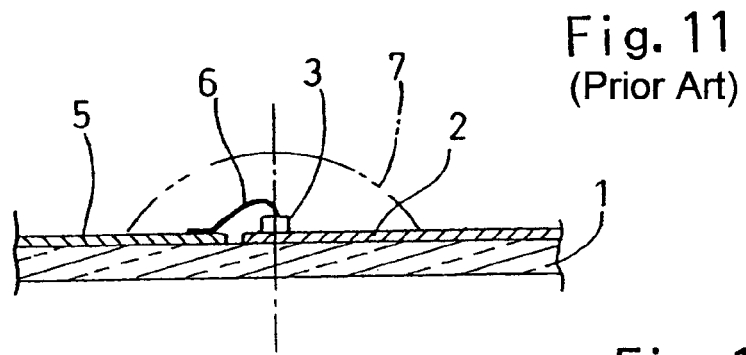
FIG. 11 is a sectional view taken along lines XI—XI in FIG. 10.
Figure 12:
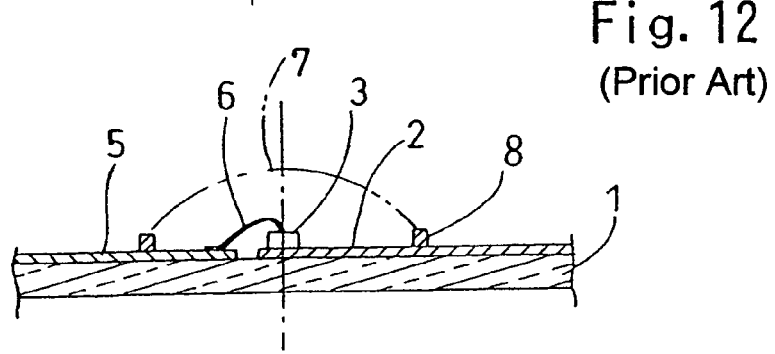
FIG. 12 is a sectional view showing another example of prior art device.

FIGS. 7, 8 and 9 show a fourth embodiment.

In the fourth embodiment, a number of light emitting devices 22 according to the third embodiment are arranged in a matrix of rows and columns on a single common wiring board 23, thereby providing a panel for displaying letters or images in full color utilizing three primary colors of light.

In the fourth embodiment, a conductor pattern 24 is formed on the entire upper surface of the common wiring board 23 except the portions formed with the first circular patterned electrodes 12b, with a ring-like gap 25 formed between the conductor pattern 24 and each of the first patterned electrodes 12b. The conductor pattern 24 is electrically connected to the first patterned electrode 12b of each light emitting device 22 via a power supply wiring pattern 26 formed on the lower surface of the common wiring board 23 and through holes 27, 28, 29.

As indicated by double-dashed lines, the obverse surface of the conductor pattern 24 is covered with an insulating film 30.

With such a structure again, the above-described advantages can be obtained, because the ring-like gap 25 is provided between the first patterned electrode 12b of each light emitting device 22 and the conductor pattern 24 and the first patterned electrode 12b is in the form of a complete circle. The power supply for the first patterned electrode 12b of each light emitting device 22 can be performed by the conductor pattern 24 formed on the upper surface of the common wiring board 23. Accordingly, the structure of the power supply wiring pattern for the light emitting device 22 can be simplified. Further, the entirety of the conductor pattern 24 can be advantageously utilized as a light reflective surface.

The invention claimed is:

1. A light emitting device comprising: a first patterned electrode and a second patterned electrode both of which made of a metal film and provided on an obverse surface of a wiring board; an LED chip mounted on the second patterned electrode; a metal wire electrically connecting the LED chip and the first patterned electrode to each other; and a lens member made of a transparent synthetic resin and provided on the obverse surface of the wiring board for packaging the LED chip and the metal wire;

wherein the first patterned electrode is circular and has a central cutout, the second patterned electrode being arranged in the cutout.

2. A light emitting device comprising: a first patterned electrode and a plurality of second patterned electrodes, the first and second patterned electrodes being made of a metal film and provided on an obverse surface of a wiring board; LED chips each mounted on a respective one of the second patterned electrodes; metal wires each electrically connecting a respective one of the LED chips and the first patterned electrode; and a lens member made of a transparent synthetic resin and provided on the obverse surface of the wiring board for packaging the LED chips and the metal wires;

wherein the first patterned electrode is circular and has a central cutout, the second patterned electrodes are arranged in the cutout while being equally spaced from each other along a circumference of a circle which is generally concentric with the circle of the first patterned electrode, and wherein the metal wires electrically connecting the LED chips mounted on the second patterned electrodes to the first patterned electrode extend radially outward.

3. The light emitting device according to claim 1, wherein the wiring board has a reverse surface formed with a power supply wiring pattern for electrical connection to the first patterned electrode and the second patterned electrode via a through-hole formed in the wiring board.

4. The light emitting device according to claim 2, wherein the cutout of the first patterned electrode has a peripheral edge which includes an indentation entering between the second patterned electrodes.

5. A method of making a light emitting device, comprising the steps of: forming, on a wiring board, a first patterned electrode of a metal film into a circular configuration while forming a cutout at a center of the first patterned electrode; forming a second patterned electrode of a metal film in the cutout; mounting an LED chip on the second patterned electrode; electrically connecting the LED chip and the first patterned electrode to each other via a metal wire; and forming a lens member by dropping transparent synthetic resin in a liquid state onto the first patterned electrode so that the transparent synthetic resin bulges to cover the LED chip and the metal wire and then hardening the synthetic resin.

6. The light emitting device according to claim 2, wherein the wiring board has a reverse surface formed with a power supply wiring pattern for electrical connection to the first patterned electrode and the second patterned electrode via a through-hole formed in the wiring board.

* * * * *